(12) United States Patent
Grudin et al.

(10) Patent No.: US 7,667,156 B2
(45) Date of Patent: Feb. 23, 2010

(54) BIDIRECTIONAL THERMAL TRIMMING OF ELECTRICAL RESISTANCE

(75) Inventors: Oleg Grudin, Montreal (CA); Leslie M. Landsberger, Westmount (CA); Gennadiy Frolov, Montreal (CA); Lyudmila Grudina, Montreal (CA)

(73) Assignee: Microbridge Technologies Inc., Montreal (CA)

( * ) Notice: Subject to any disclaimer, the term of this patent is extended or adjusted under 35 U.S.C. 154(b) by 549 days.

(21) Appl. No.: 11/229,567

(22) Filed: Sep. 20, 2005

(65) Prior Publication Data

US 2007/0034608 A1 Feb. 15, 2007

Related U.S. Application Data

(63) Continuation of application No. PCT/CA2004/000398, filed on Mar. 19, 2004.

(60) Provisional application No. 60/455,887, filed on Mar. 20, 2003.

(51) Int. Cl.
*H01C 17/26* (2006.01)
*H01L 49/00* (2006.01)
(52) U.S. Cl. ............... 219/68; 29/610.1; 29/612; 338/195
(58) Field of Classification Search .......... 219/68; 438/10, 13, 385, 469, 330, 378, 795, 799; 338/195; 29/610.1, 612
See application file for complete search history.

(56) References Cited

U.S. PATENT DOCUMENTS

| | | | | |
|---|---|---|---|---|
| 2,639,246 A | * | 5/1953 | Dunlap, Jr. ............... | 438/795 |
| 3,723,257 A | | 3/1973 | Bhattacharyya | |
| 3,916,142 A | * | 10/1975 | Ennis ............... | 219/68 |
| 4,782,202 A | * | 11/1988 | Sawae et al. ............... | 219/68 |
| 5,369,245 A | * | 11/1994 | Pickering ............... | 438/795 |
| 5,466,484 A | * | 11/1995 | Spraggins et al. ............... | 438/385 |
| 5,635,893 A | * | 6/1997 | Spraggins et al. ............... | 219/209 |
| 5,679,275 A | | 10/1997 | Susak et al. | |
| 5,742,307 A | | 4/1998 | Hawkins et al. | |
| 6,306,718 B1 | * | 10/2001 | Singh et al. ............... | 438/385 |
| 7,119,656 B2 | * | 10/2006 | Landsberger et al. ....... | 338/195 |

(Continued)

FOREIGN PATENT DOCUMENTS

WO WO 03/023794 3/2003

(Continued)

OTHER PUBLICATIONS

Babcock et al., "Precision Electrical Trimming of Very Low TCR Poly-SiGe Resistors", Jun. 2000, IEEE Electron Device Letters, vol. 21, No. 6, pp. 283-285.*

(Continued)

*Primary Examiner*—Geoffrey S Evans
(74) *Attorney, Agent, or Firm*—Ogilvy Renault LLP

(57) ABSTRACT

There are described various methods and circuits for trimming the parameter value of a thermally mutable electrical component in two directions. A sequence of heat pulses is selected as a function of thermal history using an adaptive trimming algorithm, where parameters of the sequence of heat pulses are based on a resulting impact of previous heating pulses. Direction of trimming, trimming increment, and remaining trimming distance can all be used to determine the parameters of succeeding heat pulses, wherein the parameters of the pulses can be, for example, amplitude, duration, and time interval between pulses.

38 Claims, 16 Drawing Sheets

U.S. PATENT DOCUMENTS

| | | | |
|---|---|---|---|
| 7,555,829 B2 * | 7/2009 | Grudin et al. | 29/610.1 |
| 2002/0033519 A1 * | 3/2002 | Babcock et al. | 257/536 |
| 2004/0180507 A1 * | 9/2004 | Zhang et al. | 438/385 |
| 2006/0279349 A1 * | 12/2006 | Grudin et al. | 327/334 |

FOREIGN PATENT DOCUMENTS

| | | | |
|---|---|---|---|
| WO | WO-03/023794 | * | 3/2003 |

OTHER PUBLICATIONS

Feldbaumer D.W. et al. *Pulse current trimming of polysilicon resistors* IEEE Transactions on Electron Devices, IEEE Inc. vol. 42, No. 4 p. 689-696 U.S.A. 1995 (XP000513264).

Mandurah M.M. et al. *Dopant segregation in polycrystalline silicon* Journal of Applied Physics, vol. 51, No. 11 p. 5755-5763 U.S.A. 1980 (XP002254692).

* cited by examiner

US 7,667,156 B2

BIDIRECTIONAL THERMAL TRIMMING OF ELECTRICAL RESISTANCE

CROSS-REFERENCE TO RELATED APPLICATIONS

This application is a continuation of PCT/CA2004/000398, filed on Mar. 19, 2004, which claims priority under 35 USC §119(e) of US provisional patent applications 60/455,887, filed on Mar. 20, 2003, and is related to PCT patent application entitled "Trimming Temperature Coefficients of Electronic Components and Circuits" having international publication number WO2004/097860 and PCT patent application entitled "Trimmable Resistors Having Improved Noise Performance" having international publication number WO2004/097861, both filed on Mar. 19, 2004, which are hereby incorporated by reference.

FIELD OF THE INVENTION

The invention relates to the field of trimmable resistors. More specifically, it relates to a method for adaptively generating a sequence of pulses, in order to effectively adjust the electrical resistance of trimmable resistors.

BACKGROUND OF THE INVENTION

The trimming (adjustment) of electrical resistors is a widely used procedure in the manufacture of microelectronics and electronic components, and in common design of user circuits, especially where precision calibration is desired. In principle, one trims the resistor until an observable local or global circuit parameter reaches a desired value. Resistor trimming is widespread in both manufacturing of a variety of components and instruments, and in the user community.

It is known that certain thermally-mutable materials, such as polycrystalline silicon (polysilicon) or polycrystalline SiGe, respond to heating or voltage pulses above a certain threshold, by changing their electrical resistivity. Several publications describe experiences whereby the resistance is deliberately "trimmed" to a target value within a certain level of precision.

Amemiya et al (Y. Amemiya, T. Ono, K. Kato Electrical Trimming of Heavily Doped Polycrystalline Silicon Resistors IEEE Trans. Electron. Dev. vol. ED-26 (1979), 11, pp. 738-742; and US patent #4210996-1980), describe using applied voltage pulses directly to polysilicon resistors, where these trimming pulses have duration in the range of 0.5 us to 1 ms. The effect of these pulses is to trim "down" (reduce the resistance). They state that shorter pulses require higher voltages (24-28V) than longer pulses, to achieve the trimming effect. For example, 0.5 us pulses yielded 0.02% resistance decrease. They also state that the resistance can be increased and so called "recovery" can be accomplished, even to resistance values higher than the initial (as-fabricated) resistance value, $R_{init}$. They state that the "Time constant for recovery is larger than that of the trimming process." They disclose 0.01% (100 ppm) trimming accuracy.

Kato et al (K. Kato, T. Ono, Y. Amemiya A Monolithic 14 Bit D/A Converter Fabricated with a New Trimming Technique (DOT), IEEE J. Solid-State Circuits vol. SC-19 (1984), 5, pp. 802-807), also apply voltage pulses directly to polysilicon resistors, and describe a technique for stabilizing the post-trimming resistance, called the Excess Trimming and Restoration (ETR) technique. They describe that the "Trimmed R shows a slight recovery when it's left at high T for a long time" and state that it is necessary to suppress this recovery. They describe a technique by which the "resistor is intentionally over-trimmed and then restored to its required value", indicating that this recovery requires lower current. They also report 0.01% (100 ppm) accuracy, using this technique.

Feldbaumer et al (D. Feldbaumer, J. Babcock, V. Mercier, C. Chun, Pulse Trimming of Polysilicon Resistors IEEE Trans. Electron. Dev. vol. ED-42 (1995), 4, pp. 689-695), also apply voltage pulses directly to polysilicon resistors. To trim down, they apply a series of heat pulses of increasing amplitude, having 3 ms duration, with 10 ms between each pulse. They accomplished recovery, by "reapplying a current of less than the final trim current but above threshold" (where the "threshold" is the threshold below which the resistance doesn't change.) They report that the "Magnitude of recovery is small in comparison to the amount which is trimmed" for example less than 1% after trimming "down" by 20% of the as-fabricated value. They suggest that this "Offers a method to finely tune resistors which are trimmed past their target" and suggest that there is an optimal recovery current, in the range of 80% to 90% below the current of the last previous "down" pulse. They use only constant-amplitude pulses with total accumulated time of approximately 25 ms. For example they use a "Trim Pulse Width" of 1 ms and "Recovery Pulse Width" of 2.5 ms with Total Accumulated Recovery Time of 25 ms (FIG. 5 of their paper), and state that they could recover by about 1% to 2% of the resistance value using total accumulated pulse times on the order of a second or less.

Babcock et al (J. Babcock, P. Francis, R. Bashir, A. Kabir, D. Shroder, M. Lee, T. Dhayagude, W. Yindeepol, S. Prasad, A. Kalnitskiy, M. Thomas, H. Haggag, K. Egan, A. Bergemont, P. Jansen, Precision Electrical Trimming of very Low TCR Poly-SiGe Resistots IEEE Electron. Dev. Letters, vol. 21 (2000), 6, pp. 283-285), also use auxiliary heaters to heat integrated Si—Ge resistors. They disclose that they are able to recover up to ~20% higher than the as-fabricated resistance, ($R_{init}$), by applying a constant-amplitude current for 40000 s. In this publication, they also demonstrate that the TCR of a trimmed resistor varies with (is a function of) the trimmed resistance.

Babcock et al have also described in provisional patent application US 2002/0035519 a procedure of trimming involving applying a sequence of pulses having increasing amplitude (each pulse greater than the previous).

Therefore, the prior art shows methods of both increasing and decreasing the resistance of certain thermally-mutable materials, but there remain significant limitations of trimming performance. Most importantly, increasing the resistance by these methods appears to take very long times, or is quite limited in range (e.g. 1%-2%). It would be extremely advantageous, for the purpose of circuit design, to increase the precision to which a resistor can be trimmed and have this precision be achievable over a short period of time.

SUMMARY OF THE INVENTION

Accordingly, it is an object of the present invention to use an adaptive algorithm to efficiently trim the electrical resistance of thermally-mutable materials.

Another object of the present invention is to obtain a trimming precision better than 100 ppm.

Yet another object of the present invention is to trim a resistor bi-directionally in a manner that is repeatable.

Yet another object of the present invention is to provide a trimming procedure that can be completed in a short time period.

According to a first broad aspect of the present invention, there is provided a method for trimming a parameter of a resistor made from a thermally mutable material, the method comprising:
(a) subjecting the resistor to a high first temperature to trim the parameter of the material in a first direction;
(b) subjecting the resistor to a second temperature lower than the high first temperature so as to trim said parameter of the material in an opposite direction with a rate of change in the parameter that is initially rapid and gradually decreasing to a first level; and
(c) subjecting the resistor to a third temperature lower than the second temperature so as to trim the parameter in the opposite direction with the rate of change in the parameter that is greater than the first level.

Preferably, steps (b) and (c) are repeated with increasingly lower second and third temperatures and the increasingly lower second and third temperatures are selected to optimize a total trimming time. Also steps (b) and (c) comprise regularly returning the electrical component to a predetermined ambient temperature and measuring the parameter.

According to a second broad aspect of the present invention, there is provided a method for trimming a parameter of a resistor made from a thermally mutable material to a target value with a high precision, the resistor having a trimming range defined by an upper limit above which damage will occur and a lower limit below which a change in parameter value is insignificant, the method comprising: trimming the parameter to a first intermediary value within a small amount below the target value; selecting a sequence of heat pulses having low amplitudes substantially near the lower limit of the trimming range; and applying the sequence of heat pulses to the resistor to trim the parameter towards the target value.

The amplitude of the pulses is intentionally chosen to be very low, close to the lower trimming threshold, and away from the optimum amplitude for a fast trimming rate. This is done to have a slow trimming rate in order to obtain the precision desired. The heat pulses are chosen to be of varying duration and the duration of a heat pulse is dependent on at least one of an increment obtained by a preceding heat pulse, a duration of a preceding heat pulse, and a remaining distance to said target value.

According to a third broad aspect of the present invention, there is provided an apparatus for adjusting a parameter of a resistor made from a thermally mutable material, the apparatus comprising: a substrate having a portion for thermally-isolating said resistor; heating circuitry having a decision-making module for applying a sequence of heat pulses as a function of thermal history, the decision-making module applying an adaptive trimming algorithm where parameters of the heat pulses are selected based on a resulting impact of previous heating pulses, the resulting impact including a direction of trimming caused by the previous heating pulses; and measuring circuitry for measuring the parameter of the resistor.

Preferably, the decision-making module is for determining an amplitude of a heat pulse, a duration of said heat pulse, and a time interval before a succeeding heat pulse. These parameters are selected as a function of the resulting impact of previous heating pulses, such as the direction of trimming a previous pulse has resulted in, or the increment by which the parameter was trimmed from the last heat pulse. Also preferably, a heating element is in the heating circuitry to generate a sequence of heat pulses to trim the parameter.

According to a fourth broad aspect of the present invention, there is provided a method for trimming a parameter of a resistor made from a thermally mutable material to a target value, the method comprising: thermally-isolating the component on a portion of a substrate; selecting a sequence of heat pulses as a function of thermal history: using an adaptive trimming algorithm, where parameters of the sequence of heat pulses are selected based on a resulting impact of previous heating pulses, the resulting impact including a direction of trimming resulting from the previous heating pulses; and applying the sequence of heat pulses to the component to trim to the target value.

It can be appreciated that the circuit of the present invention may be part of a larger circuit, such as a Wheatstone bridge, a voltage divider, or many other types of circuits which include electrical components to be trimmed.

In this patent application, the term "thermally-mutable material" is intended to mean a material that behaves like a polycrystalline semiconductor material having electrical and/or other material properties that can be reversibly changed within a certain range by restructuring of the "grains" making up the material and/or grain boundaries, and/or spatial distribution of dopants within the grains, and/or grain boundaries. Once a change to the property is effected, it remains essentially stable for the purposes of subsequent operation. Such restructuring can be achieved by thermal cycling and/or by physical stimulation such as application of pressure, etc. In the present state of the art, polycrystalline silicon (polysilicon) and polycrystalline silicon-germanium are known to be thermally-mutable materials. While the making of resistors from polysilicon is the most common application, it is known to make a resonator from polysilicon, in which the resonant frequency of the resonator is trimmable due to changes in its mechanical properties.

DETAILED DESCRIPTION OF THE PREFERRED EMBODIMENT

Figure 1:
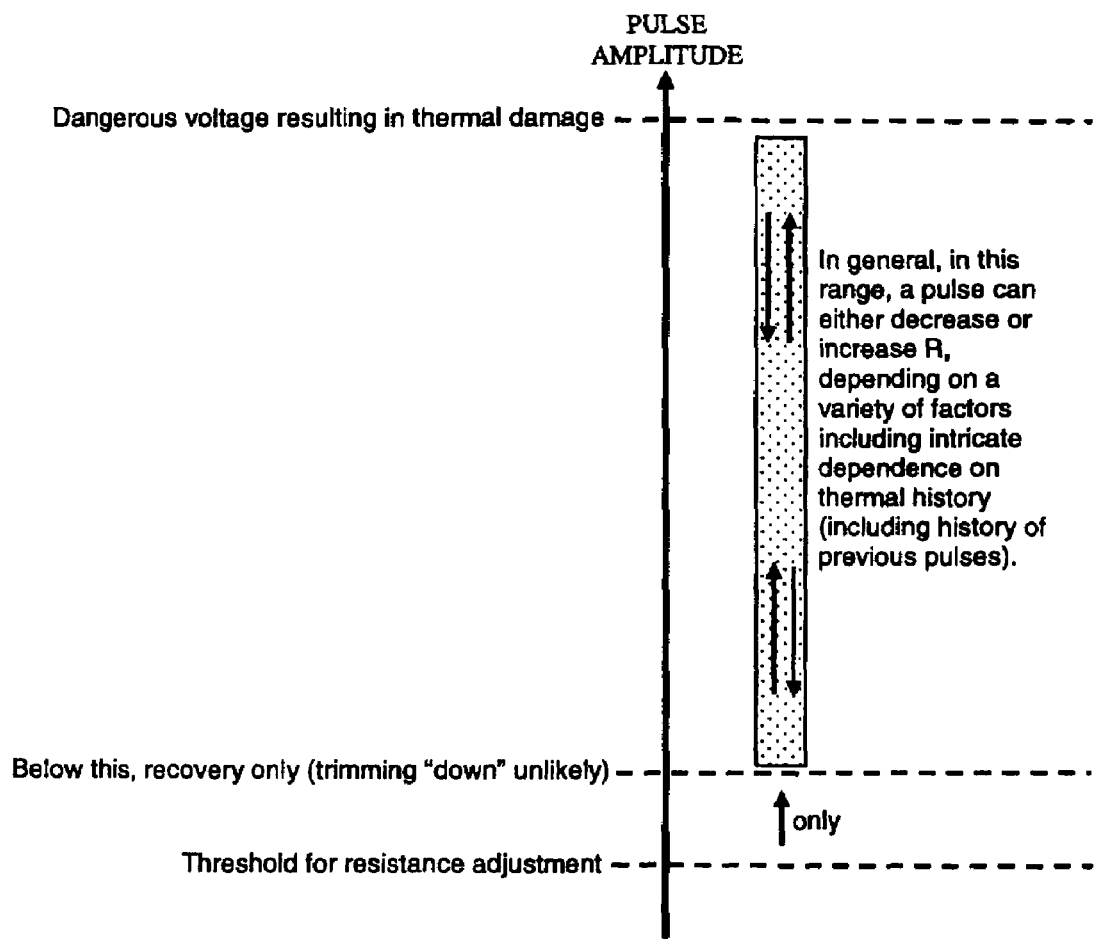
FIG. 1: Shows generally the trimming behavior vs. pulse amplitude.

The terms "heating pulses" or "heating trimming pulses", or "pulses", are used in the description for the purposes of generality. These pulses are used to raise the temperature (T) of a trimmable resistor so that it exceeds a certain threshold temperature to initiate trimming. In practice, these pulses can be generated by passing electric current through the trimmed resistor itself, or applying voltage to the trimmed resistor itself, or passing electric current through an auxiliary heater (electrically isolated from the trimmed resistor), or applying voltage to an auxiliary heater. The pulses can also be generated by laser beam or other means of heating a localized area. In all these cases, the particular method of thermal excitation of the trimmed resistor is not important for the purposes of this invention.

Electro-thermal trimming allows to reduce resistance value of polysilicon resistor (or made from other polycrystalline material such as polycrystalline Si—Ge) from its "as-manufactured" value $R_{ini}$ to a certain value $R_{min} \sim (0.3 \ldots 0.5)*R_{ini}$. It is known that after trimming "down", increase of resistance ("recovery") is also possible, to an approximate value $R_{max}$, which is typically less than $R_{ini}$. Trimming of the resistance $R_{actual}$ can be repeated many times between $R_{max}$ and $R_{min}$ ($R_{min} < R_{actual} < R_{max}$). Usually recovery is initiated by heating pulses lower than previously applied heating pulses which caused trimming "down." The same heating pulse may have different effects of trimming "up" or "down" depending on amplitude and effect of previously applied heating pulses. Therefore the result of an applied trimming pulse is sensitive to thermal history. The lower limiting value, $R_{min}$, is due to the fact that its further reduction requires higher heating pulses that may cause catastrophic damage to the resistor. Increase of the resistance higher than $R_{max}$ on the other hand, requires much longer trimming time, even hours (Babcock et al (J. Babcock, P. Francis, R. Bashir, A. Kabir, D. Shroder, M. Lee, T. Dhayagude, W. Yindeepol, S. Prasad, A. Kalnitskiy, M. Thomas, H. Haggag, K. Egan, A. Bergemont, P. Jansen, Precision Electrical Trimming of very Low TCR Poly-SiGe Resistots IEEE Electron. Dev. Letters, vol. 21 (2000), 6, pp. 283-285), Canadian Microelectronic Corporation Report #IC95-08 September 1995). For very long trimming time, $R_{max}$ can be raised higher than $R_{ini}$ (Canadian Microelectronic Corporation Report #IC95-08 September 1995, and O. Grudin, R. Marinescu, L. M. Landsberger, D. Cheeke, M. Kahrizi, "CMOS Compatible High-Temperature Micro-Heater: Microstructure Release and Testing," Canadian Journal of Elec. And Comp. Engineering, 2000, Vol. 25, No. 1, pp. 29-34). Practical trimming processes taking a few seconds are possible in the range $R_{min} < R_{actual} < R_{max} < R_{ini}$.

The adaptive algorithm involves applying a sequence of pulses, interleaved with measurements of resistance, by which each pulse can learn from the previous sequence of pulses. The important principles of the adaptation may be peculiar to thermally-mutable materials such as polysilicon and polycrystalline SiGe.

The basic principles are:

In order to attain recovery which is fast over a wide resistance range, the pulse amplitudes are adaptively decreased, from one set of pulses to the next, in order to maintain a high rate of recovery. This adaptive decrease can be done until the threshold for resistance adjustment is reached.

In order to maximize the recovery range and speed to attain the greatest recovery range, the sequence of recovery pulses begins with a high-amplitude pulse, whose initial effect may be in some cases a large trim "down", and whose consequence is to allow more steps of decrease in pulse amplitude as described above. This allows recovery to higher resistance values. Note that the first high-amplitude pulse may be even higher than the last "down" pulse.

In order to maximize recovery speed for a given recovery range, the amplitude of the first high-amplitude pulse is to be chosen appropriately. For fast recovery over a moderate range, an intermediate amplitude of the first pulse in a recovery sequence is preferable.

In order to maximize the speed of recovery over an intermediate recovery range, the pulse amplitudes are decreased as soon as the recovery speed drops below a certain fraction of the initial speed at a given pulse amplitude.

In order to attain very precise recovery, pulses having amplitude just above the threshold for resistance change can be used, to obtain very low recovery rate, also in order to obtain very fine adjustment.

In order to accelerate trimming "down", especially when the desired magnitude of adjustment ("distance") is a significant fraction of the resistance value, the pulse amplitude is adaptively increased, depending on the decrement in resistance obtained by the previous pulse, and on the remaining "distance" to the target resistance.

Also in order to accelerate trimming "down", when high precision is not required, or when the remaining "distance" to the target is large, the time interval between pulses, during which the resistance is measured, can be shortened, (for example to 25 ms instead of 50 ms which would be needed for a high-precision accurate measurement).

In order to attain high-precision trimming, if the target resistance, $R_{target}$, is passed (during recovery), several cycles (trim down—recovery up) can be performed, where the pulse parameters from the previous cycle are "inherited" by the next pulse and processed such that the probability of passing the target is lower in the next cycle.

FIG. 1 describes qualitatively the trimming behavior as a function of pulse amplitude above the threshold for resistance change. In particular, it indicates that the direction of trimming ("down" vs. recovery), resulting from a given pulse amplitude, can vary depending on a variety of factors, notably the thermal history of pulses applied, as well as resistor layout, thermal isolation, resistivity, resistive material dimensions, grain parameters, heater layout and resistance. It also indicates the presence of a small range of pulse amplitudes, just above the threshold, which gives only recovery in most cases. The upper threshold limit, above which thermal damage can occur, is dependent on various physical factors. It can be the limit at which the heating element will be damaged if it were to receive more current. It can be the limit at which the micro-platform can be damaged if it were heated beyond that limit. It can also be the maximum heat the functional resistor can withstand without being damaged. Generally, the physical limit that is the lowest between the functional resistor, the heating element, and the surrounding environment such as a micro-platform will set the upper threshold limit for trimming of the functional element.

All of the resistors featured in the trimming examples in this patent application were made from polysilicon from a standard CMOS integrated circuit manufacturing process. The polysilicon sheet resistance was about 40 ohms/square. The polysilicon resistors being trimmed, and their associated heater-resistors, were embedded in micro-membranes made from typical CMOS surface films, including silicon dioxide and silicon nitride, having thermal isolation on the order of 30-50 K/mW.

Figure 2:
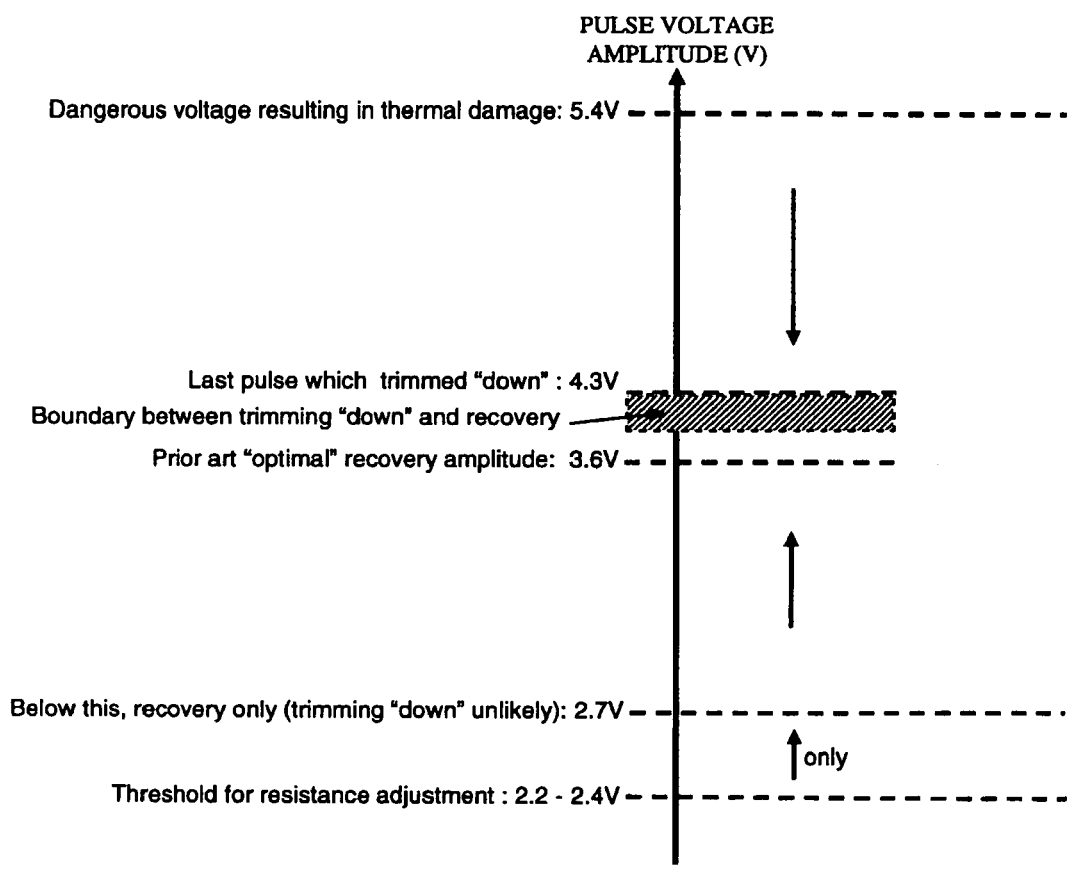
FIG. 2: Shows a quantitative example of the direction of trimming vs. pulse amplitude.

FIG. 2 gives a quantitative example of the trimming behavior, for a particular resistor, having as manufactured value 7200 Ohms, trimmed down to about 5500 Ohms, and having been trimmed bidirectionally several tens of times in the range of 5200 Ohms to 6500 Ohms, which had recently been subjected to a recent sequence of "down" pulses, ending at V=4.3V. In this case, the direction of trimming is strongly influenced by the amplitude of the last "down" pulse, (even if there are several other recovery pulses in between). There is a rough threshold above which short exposure at a given amplitude, or a sequence of pulses having increasing amplitude, causes decrease in the resistance.

Another trend observed in relation to the trimming of polysilicon is that if one continues to increase the amplitude of the applied pulses, eventually (usually after one or two such increasing pulses), one will achieve trimming "down". Also, if after trimming "down", one applies a sequence of pulses having decreasing amplitude, then eventually (usually after one or two such decreasing pulses), one will achieve "recovery". However, the behavior of the resistance as a function of exposure at a constant amplitude is not straightforward. Trimming "down" will be achieved for short enough accumulated time, but after longer exposure at that constant amplitude, the resistance will eventually rise, and can rise above its value at the beginning of the constant-amplitude exposure (but this could take hours).

In general, one important characteristic of electro-thermal resistor trimming is its dependence on thermal history. The same heating pulse may result in either increase or decrease of resistance, depending on the amplitude and effect of previous pulses. Thus, a "rigid" algorithm with fixed matching parameters may not be effective and accurate because the parameters of the heating pulses should essentially depend on a combination of conditions such as the difference between the as-manufactured resistance $R_{init}$ and the target resistance $R_{target}$, and the sign and magnitude of the difference between the present resistance $R_{actual}$ and the target resistance $R_{target}$, the positioning of $R_{actual}$ and $R_{target}$ with respect to $R_{init}$, and history of thermal cycles (which may not be known). Therefore a trimming algorithm with an adaptive character is preferable, where the heating pulse parameters (amplitude, pulse width and interval between pulses) are decided or adjusted based on analysis of previous heating pulses, resulting resistance changes, trimming rate, "distance" to target and required precision of next trimming shot.

Adaptive Decrease of Recovery Pulse Amplitude: Improvement of the recovery stage is based on the following experimentally-discovered phenomena. A polysilicon (doped having sheet resistance of 40 Ohms/square) resistor, called the "functional" resistor, with as-manufactured resistance of 7200 Ohms is located on a suspended microstructure. An auxiliary "heater" resistor with resistance of 960 Ohms is placed on the same microstructure close to the functional resistor, and serves to heat the micro-structure and trim the functional resistor. The functional resistor is connected in series with a constant metal resistor having resistance 21.9 kOhms, in a voltage divider configuration. A constant voltage of 2.5V is applied to this voltage divider, and the voltage drop across the functional resistor is measured using an automated (computer-controlled) data acquisition board (including an 8-channel 12-bit ADC and 4-channel 12-bit DAC). Then the resistance of functional resistor is calculated. Self-heating of the functional resistor caused by the measurement current (<100 μA), does not exceed 1.5° C. The data acquisition board is used also to apply voltage pulses to the heater (electrically isolated from functional resistor). The temperature rise in the described structure can exceed 600-700° C., causing a brightly glowing orange color, visible by microscope.

Figure 3:
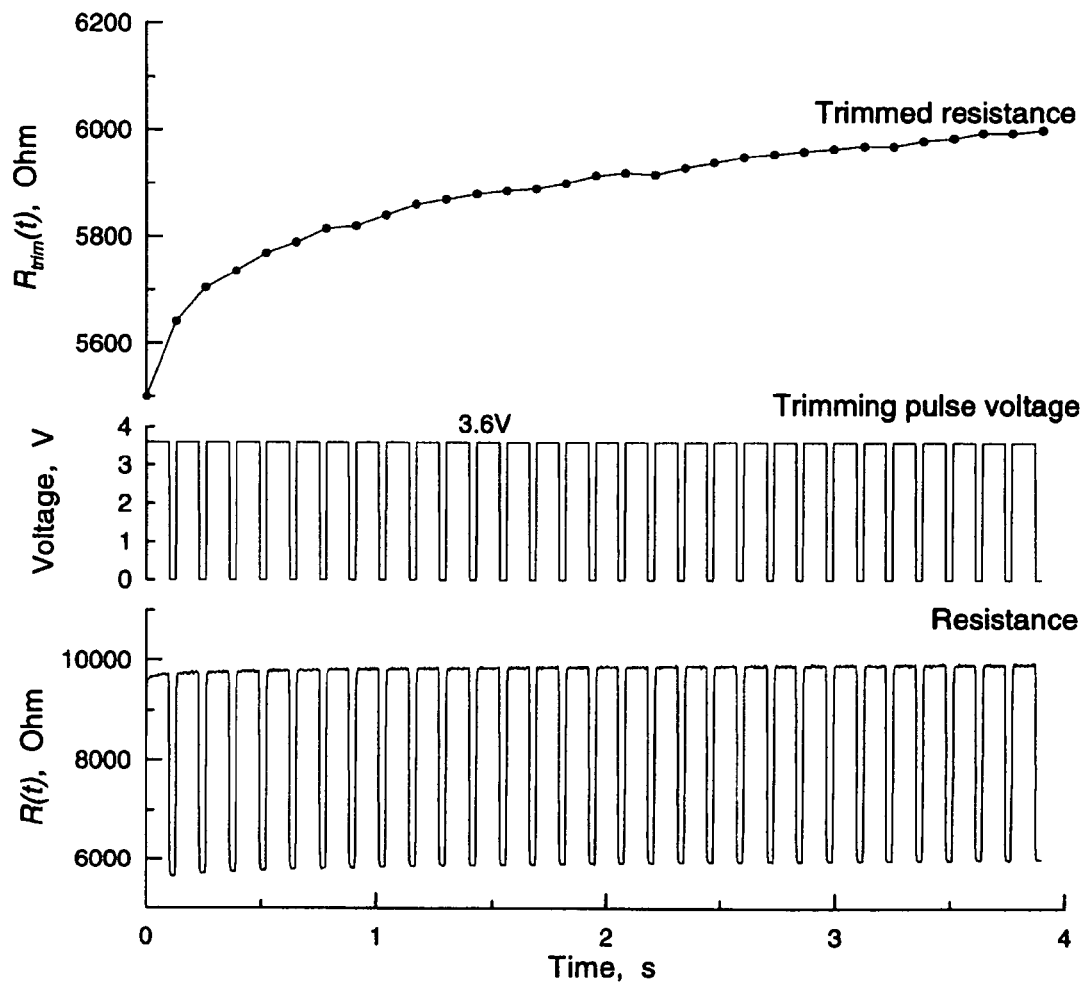
FIG. 3: Shows resistance recovery at a constant recovery voltage of 3.6V (near optimal, according to the prior art, about 85% of the last "down" pulse).
Figure 4:
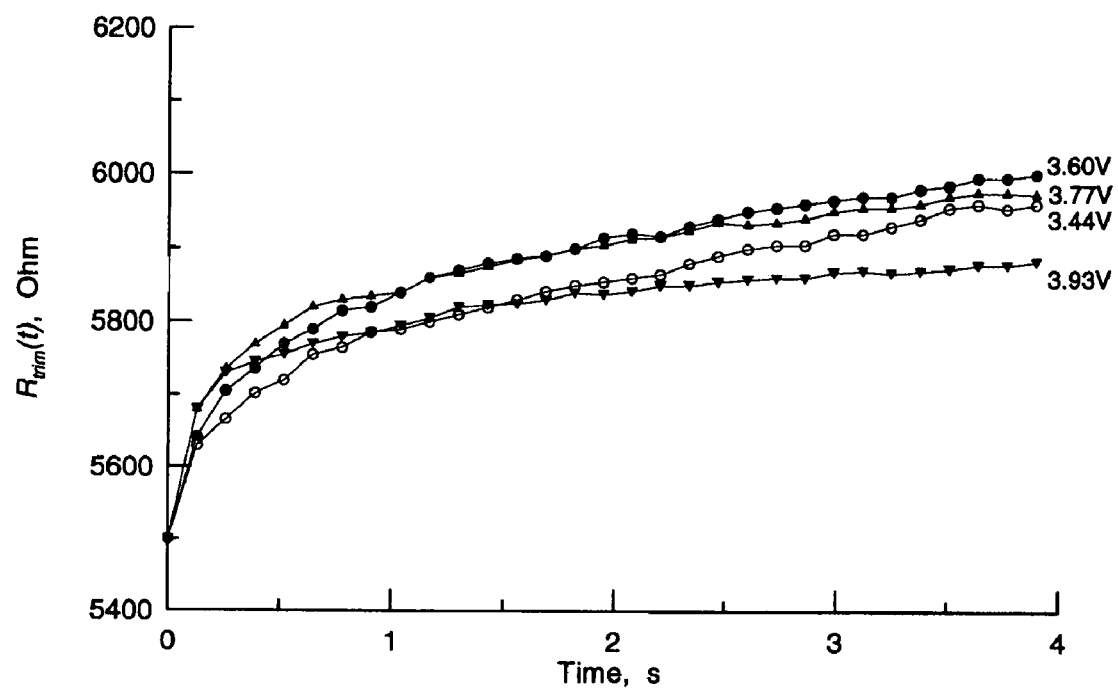
FIG. 4: Shows resistance recovery of the same resistor as in FIG. 3, at constant recovery voltages of 3.44V, 3.6V, 3.77V, 3.93V, demonstrating that 3.6V is near optimal, in accord with the prior art.

The functional resistor is trimmed down, using pulses from the DAC, to 5500 Ohms. Then the recovery stage is begun. FIG. 3 shows the resistance recovery of the functional polysilicon resistor when a constant voltage of 3.6V is applied to the heater. The accompanying high temperature results in instantaneous resistance rise up to approximately 10000 Ohms, shown at the bottom of the figure. Periodically, every 130 ms, the heating voltage is turned off for an interval of 30 ms, in order to allow the structure to cool down. The so-trimmed resistance of the functional resistor, $R_{trim}$, is then measured at room temperature, at the end of the 30 ms interval. FIG. 3 shows the application of 30 pulses, each having amplitude 3.6V, the entire sequence taking approximately 4 seconds. At the end of this sequence, the resistance is seen to have increased by 500 Ohms, up to 6000 Ohms.

Figure 14:
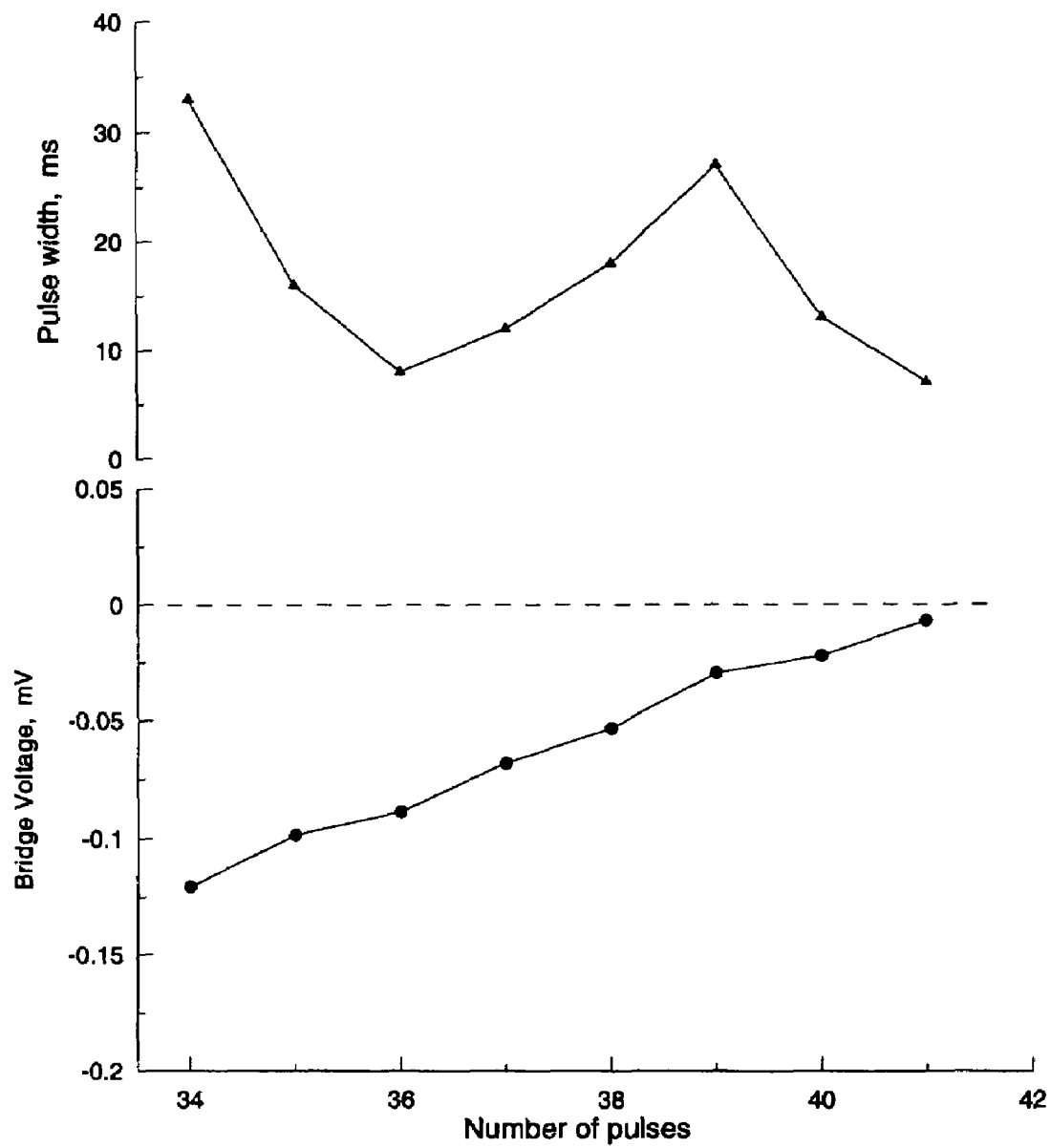
FIG. 14: Shows a magnified view of the circuit response to last few pulses of FIG. 13.

Analogous recovery cycles were executed with constant heating voltages of 3.44V, 3.77V and 3.93V, respectively, in each case starting from the same resistance of 5500±2 Ohms. The results of these constant-voltage recovery cycles are shown in FIG. 14. These results are consistent with the experimental findings of Feldbaumer et al (D. Feldbaumer, J. Babcock, V. Mercier, C. Chun Pulse Trimming of Polysilicon Resistors IEEE Trans. Electron. Dev. vol. ED-42 (1995), 4, pp. 689-695), since an "optimal" recovery voltage of 3.6V was found, giving 500 Ohms of recovery, while the other (higher and lower) applied heater voltages gave significantly lower recoveries (3.44V gave 460 Ohms, 3.77V gave 473 Ohms, 3.93V gave 380 Ohms).

Figure 5:
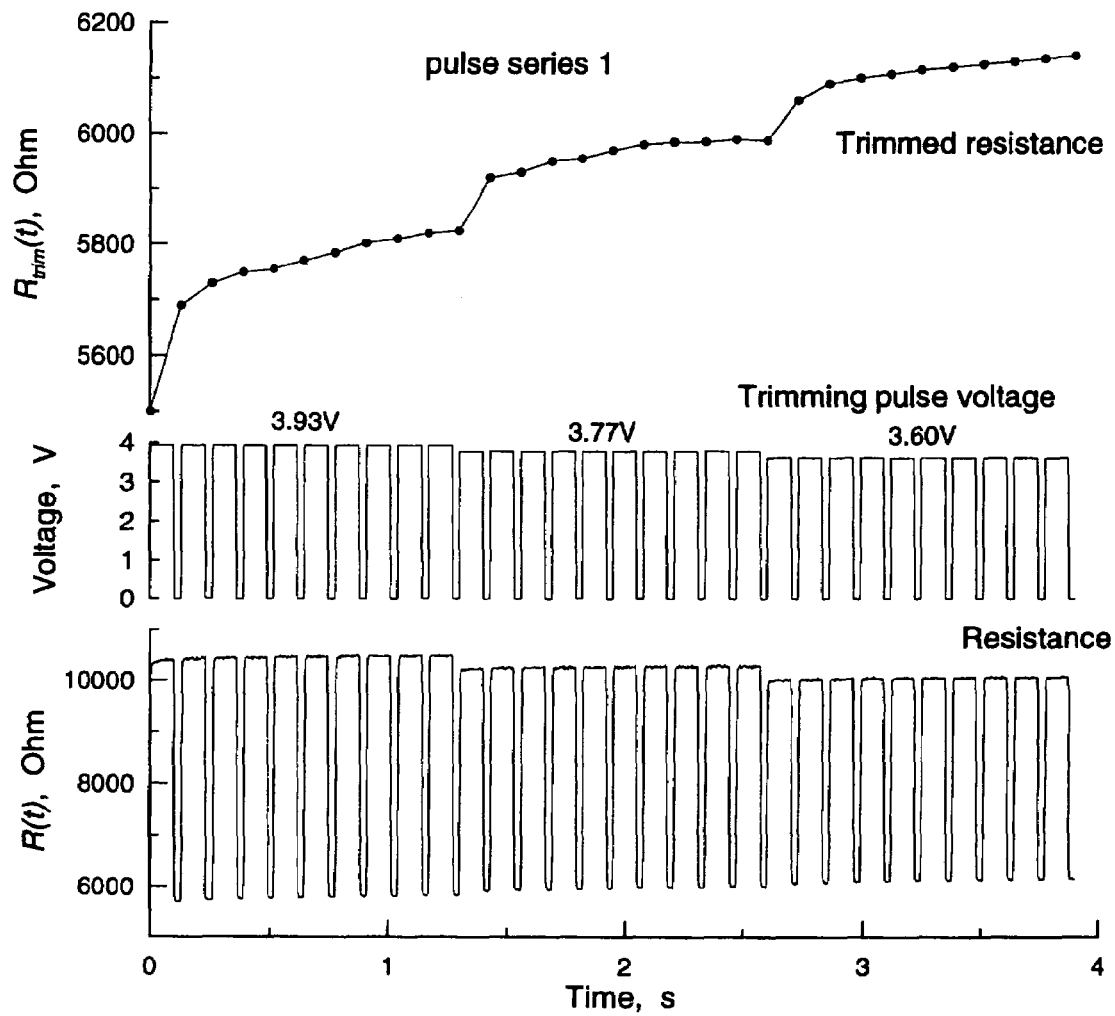
FIG. 5: Shows the result of pulse-series-1, an example of the invented decreasing sequence of recovery pulses, with acceleration of recovery at each decrement of pulse amplitude.
Figure 6:
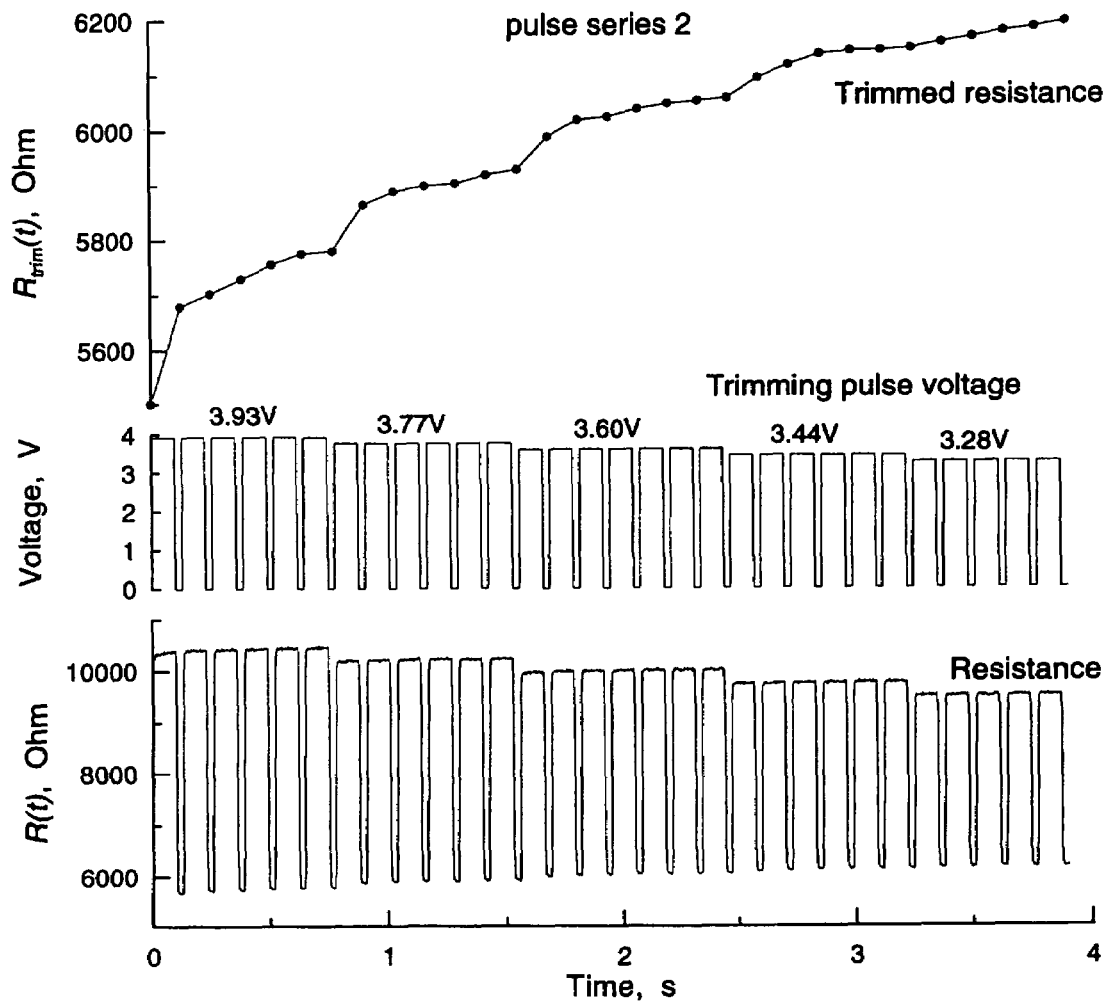
FIG. 6: Shows the result of pulse-series-2, another example of the invented decreasing sequence of recovery pulses.

The above experiments are to be compared to the recovery processes using the presently invented adaptive recovery heating pulse sequences. Two examples are shown in FIGS. 5 and 6, where sequences of pulses having voltages 3.93V, 3.77V, and 3.60V (FIG. 5), and 3.93V, 3.77V, 3.60V, 3.44V, and 3.28V (FIG. 6), were used. Significantly greater recoveries of 640 Ohms and 700 Ohms were reached in the same 4-second time period.

Figure 7:
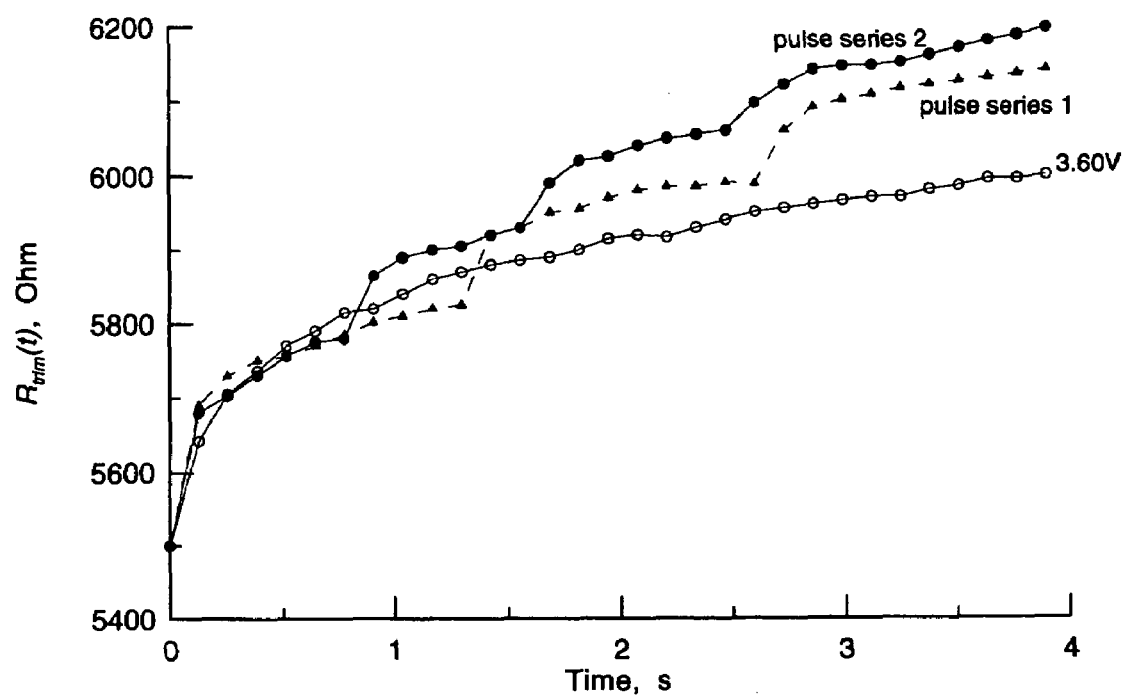
FIG. 7: Compares the speed and range of recovery of the sequences using adaptive decrements, with the speed and range of recovery of the sequence analogous to the prior art.

The above-described experiments, summarized for comparison in FIG. 7, demonstrate two advantages to the adaptive decreasing of heating-pulse amplitude: a) a greater recovery range can be attained; and b) an equal recovery range can be reached faster, (for example, a 500 Ohm recovery can be reached in less than 2 s using the adaptive pulse sequence).

Figure 8:
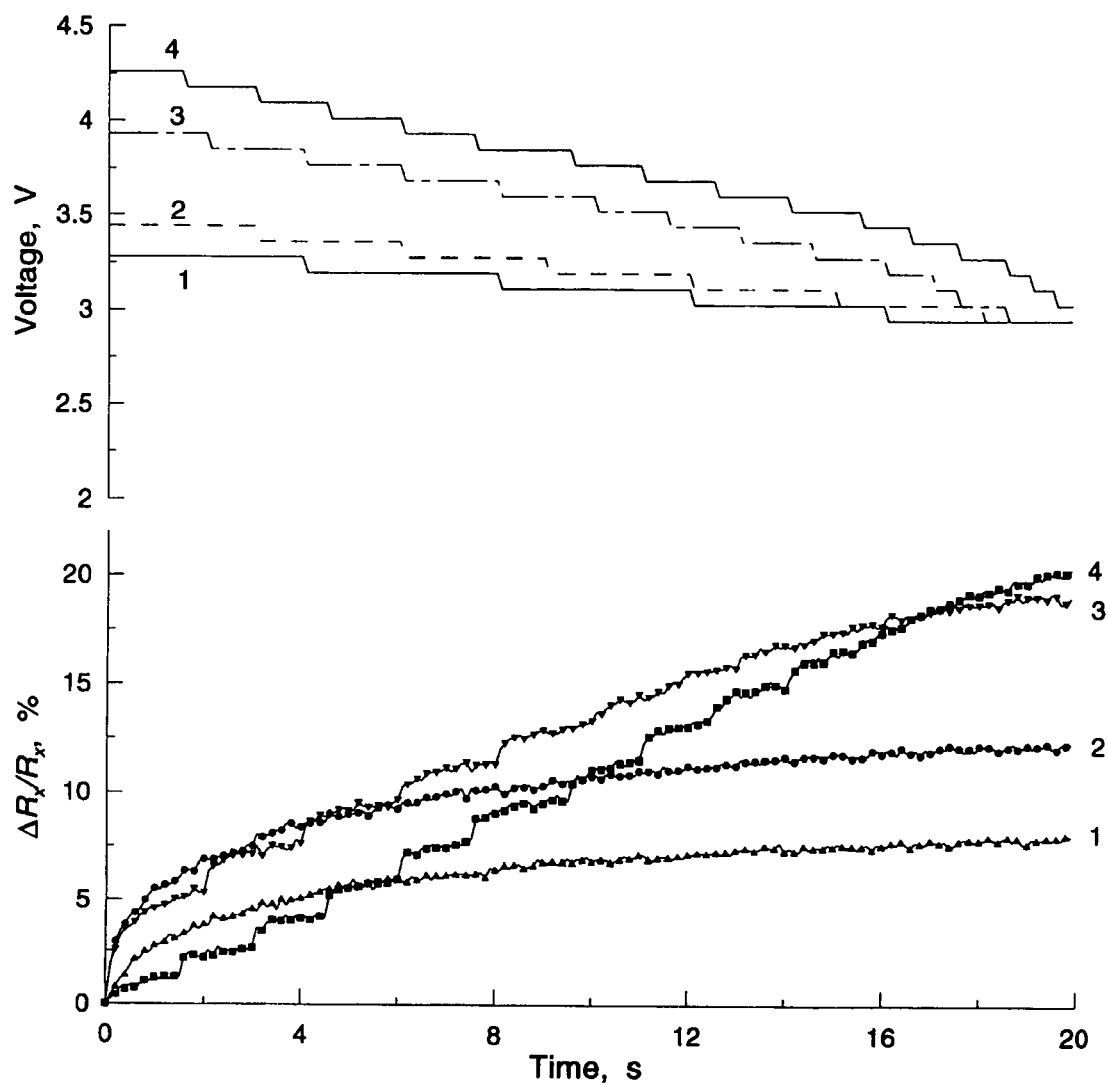
FIG. 8: Compares recoveries achieved from four 20-second recovery pulse sequences, each beginning at different pulse amplitudes, and ending at approximately the same pulse amplitude. The off-cycles (during which the resistances were measured), were executed, but are not shown.

FIG. 8 compares "deeper" recoveries achieved from longer (20-second) recovery pulse sequences. Four 20-second recovery pulse sequences were selected, each beginning at different pulse amplitudes, and ending at approximately the same pulse amplitude. As was done in previous figures, heating was interrupted for 30 ms every 100 ms to record the room-temperature resistance, $R_{x1}$. For visual clarity, these interruptions are not shown in the figure. Thus, note that for these experimental 20-second sequences, the effective trimming time is 20 s*0.7=14 s (70 ms heating and 30 ms cooling). In practice, the adjustment algorithm could reduce these interruptions to enhance efficiency).

The initial values for all four of the recovery pulse sequences was 5500 Ohms, and the last "down" pulse for all of them was approximately 4.6V. All four of the recovery pulse sequences used decrements of 0.08V, at each step (seen at the top of FIG. 8).

Pulse sequence #1 begins at 3.3V and decreases in steps to 2.95V. The recovery obtained in 20 s is approximately 8%.

Pulse sequence #2 begins from 3.44V and deceases to 2.95V. Recovery≈12%.

Pulse sequence #3 begins from 3.93V and decreases to 2.95V. Recovery≈18%.

Pulse sequence #4 begins from 4.26V and decreases to 3.03V. Recovery≈20%.

It can be seen in FIG. 8 that the "optimum" speed depends on the recovery range required. The table below shows in bold and underlined the optimum sequence for a given recovery % (these numbers are valid for a given polysilicon, trimmed to a given initial value, with a given last "down" pulse amplitude).

| Recovery Time, s | Recovery, % | | | |
|---|---|---|---|---|
| | Sequence 1 | Sequence 2 | Sequence 3 | Sequence 4 |
| 0.2 | 0.85 | 2.9 | 2.5 | 0.44 |
| 1 | 2.8 | 5.5 | 4.6 | 1.25 |
| 5 | 5.6 | 9.0 | 9.15 | 5.6 |
| 10 | 6.8 | 10.8 | 13.3 | 11.0 |
| 15 | 7.5 | 11.8 | 17.3 | 16.5 |
| 20 | 8.0 | 12.2 | 19.0 | 20.3 |

In this example, for recovery less than 5.5%, sequence #2 gives the fastest recovery. For recovery between about 5.5% and 18%, sequence #3 gives the fastest recovery. For recovery of about 20% or more, sequence #4 gives the fastest recovery.

The choice of heating pulse amplitude significantly depends on the desired amount of recovery. The tendency is that "deeper" recovery requires higher pulse amplitudes at the beginning of recovery, while moderate recovery can be executed much faster if lower pulse amplitudes are used (for example, 5% recovery is obtained almost 5 times faster for sequence #2 than for sequence #4). Note that sequence #1 is not fastest for any recovery amount.

Figure 9:
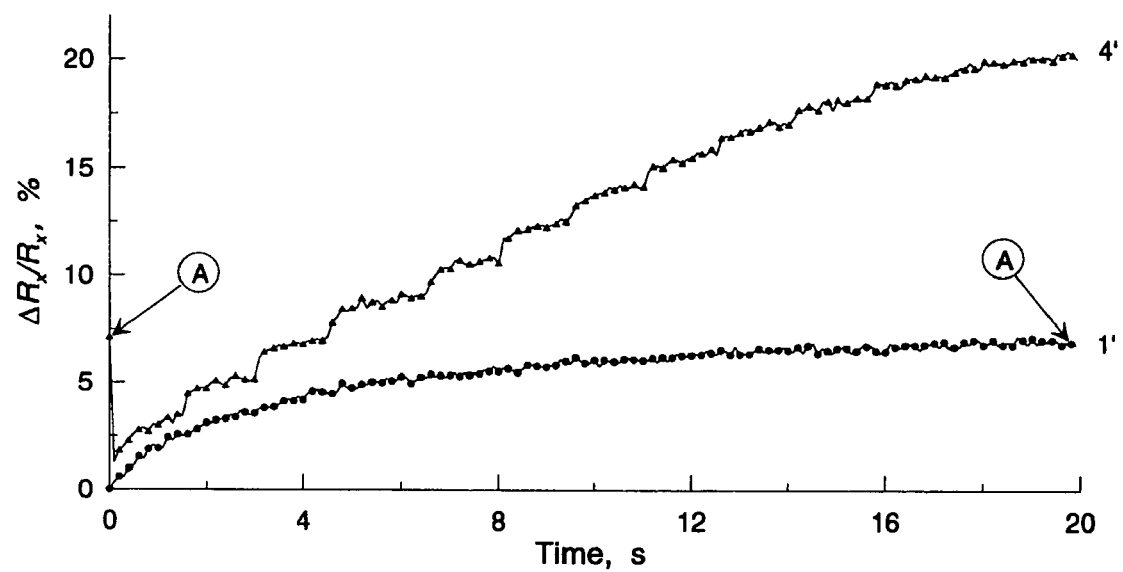
FIG. 9: Shows the resistance response when sequence #1 in FIG. 8 (1' in this figure) is immediately followed by sequence #4 (4' in this figure). At the end of sequence #1', the resistance is at "A". Upon application of the first pulse of sequence #4', the resistance drops dramatically, and then rises to a substantially higher value than "A".

FIG. 9 illustrates an interesting phenomenon regarding the resistance response when sequence #1 in FIG. 8 (called 1' in FIG. 9), is immediately followed by sequence #4 (called 4' in FIG. 9), for the same resistor having initial value 5500 Ohms. At the end of sequence #1', the resistance is at "A" (5890 Ohms, up approximately 8% from 5500 Ohms). If greater recovery is needed, another pulse sequence such as #3 or #4 should be used. Upon application of the first pulse of sequence #4', the resistance drops dramatically, and then rises to a substantially higher value than "A" (to >20% higher than 5500 Ohms).

The invented heating pulse sequence can be further optimized. Note that the recovery rate decreases with time at constant voltage, but significantly increases immediately after the heating pulse is reduced. This is counter-intuitive in view of the "optimal" notions found in the prior art. Adaptive regulation of heating pulse amplitude is preferable as the resistance recovery rate reaches a certain minimal level.

Figure 10:
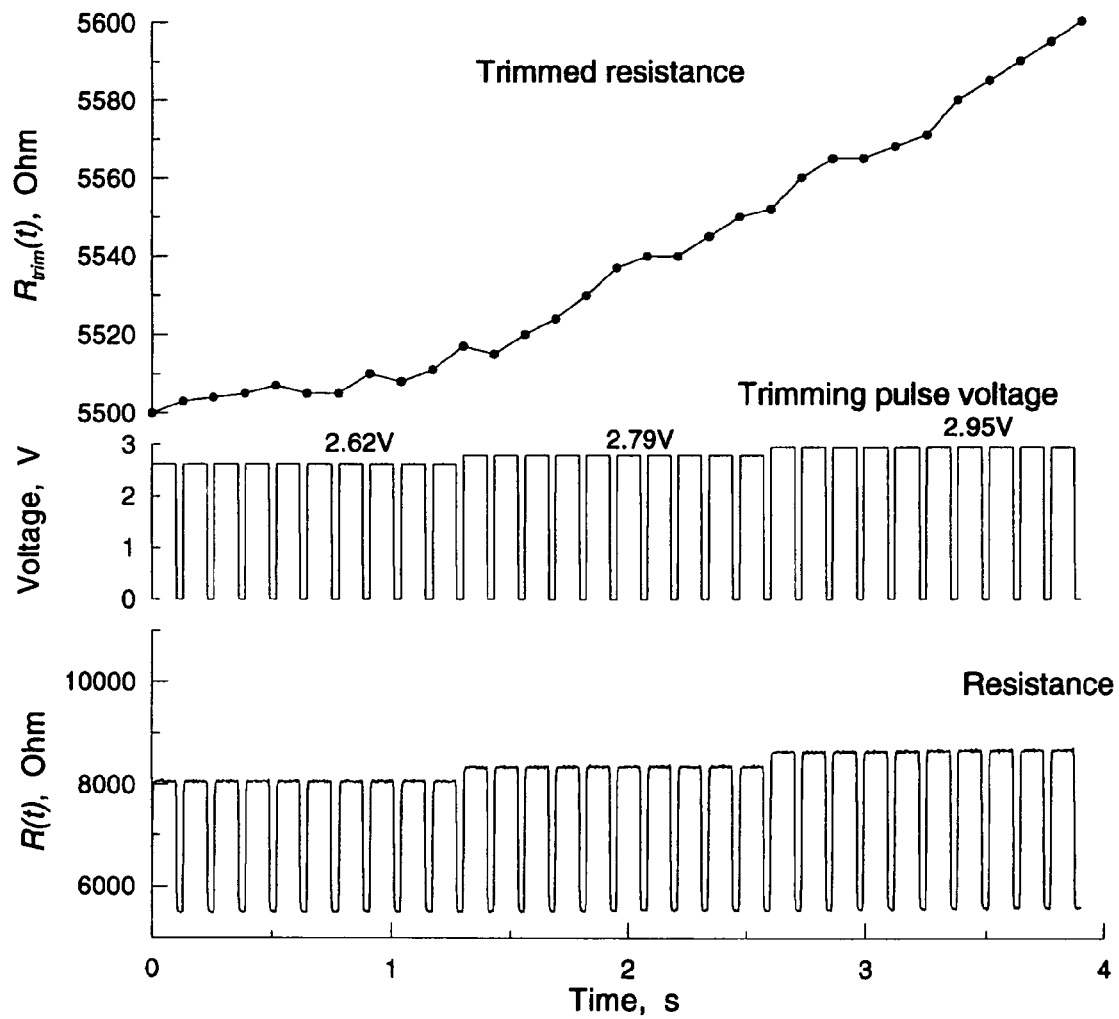
FIG. 10: Shows very fine recovery at pulse amplitudes just above the threshold for adjustment. (Note the change in scale from the previous plots.)

High-Precision Recovery: For the purposes of effective, accurate and precise trimming, it is not only important to recover quickly—it is often important to recover intentionally very slowly. Otherwise approaching a target resistance with an accuracy better than 100 ppm (0.01%) becomes problematic. Two techniques are presented, which can be used separately or in combination:

Use shorter recovery pulses, at a given recovery pulse amplitude;

Use lower recovery pulse amplitudes, just above the threshold for resistance change. Heating pulses with much lower amplitudes than mentioned in the examples above, can be used. FIG. 10 shows resistance recovery when heating pulses of 2.62V, 2.79V and 2.95V are applied (with otherwise the same experimental conditions as described above). The noise in resistance measurements is caused by the limited resolution of the 12-bit ADC, limits the accurate recording of fine changes in resistance obtained at 2.62V (and at lower voltages). An important experimental result is that the increase in heating pulse amplitude compared to the previous pulse gives an increase of the resistance (not a decrease as found by several authors in the prior art, who reported using heating pulses with increasing amplitude to trim resistance downward). The average resistance increases obtained at 2.62V were in the range of a few 100 ppm per pulse.

Usage of such low recovery rate, combined with short heating pulses, is useful and convenient because short heating pulses with easily-controlled duration of 5-30 ms, can give resistance increments as low as a few ppm or less.

Adaptive Regulation of Pulse Width and Interval Between Heating Pulses: In general, the requirements for high precision, say 0.01% or lower deviation from the target resistance, can be reached when the recovery rate is properly controlled. It is preferable to have high recovery rate when the "distance" from the target is substantial. On the other hand, recovery rate reduction is important in close vicinity to the target. Regulation of pulse width is an important tool to control recovery rate and improve trimming accuracy with reduction of total trimming time.

For example, it is preferable to reduce pulse width when recovery rate should be decreased, i.e. when the component value is close to the target and/or after heating pulse amplitude has been reduced. Also, it is preferable to increase pulse width when a previous heating pulse gave insufficient resistance change and "distance" to the target is substantial.

Variation of the intervals between pulses can also be important in optimization of the adjustment process. When the distance to the target is substantial, especially at the beginning of the whole trimming process, very accurate measurement of trimmed resistance is not critical. Therefore the cooling time of the structure can be reduced in this case. On the other hand, in close vicinity to the target, highly accurate resistance measurement is important and cooling of the structure to room temperature is needed. In this case, longer intervals between heating pulses are needed.

When trimming "down" to a known target resistance, a preferred method is to over-trim by 1 to 2% of the target value (e.g. 1.5%), and then apply a pulse amplitude of approximately 90% of the last "down" pulse.

Accuracy Improvement by Multiple "down-and-recovery" Cycles: A consequence of the discrete nature of trimming/recovery steps is that there is significant probability of passing through the target resistance at the end of recovery process, especially if one is attempting to recover quickly. In this case, multiple "down-and-recovery" cycles can be executed, in order to improve trimming precision. After each previous attempt to reach the target, the next recovery heating pulse sequence can use refined (optimized) pulse parameters based on data from the previous cycle. For example, if the recovery rate was too high in the last cycle, one can change the heating pulse amplitude.

Example 1

Figure 11:
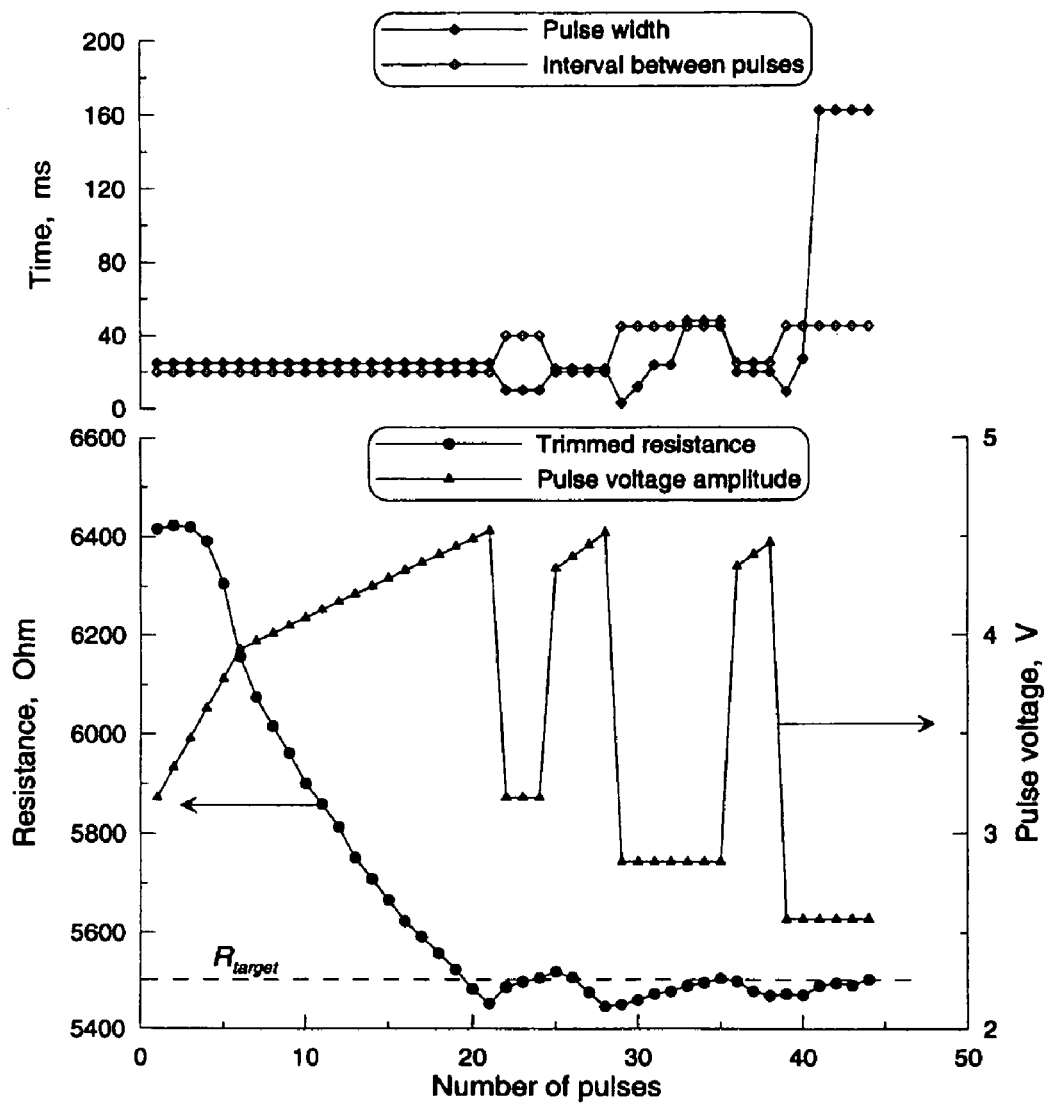
FIG. 11: Shows a quantitative example of a full adjustment pulse sequence (pulse amplitude and width, and inter-pulse interval), to trim from about 6400 ohms to 5500 ohms, including three overshoots.

FIG. 11 shows the resistance trimming process from approximately 6400 Ohms down to 5500 Ohms:

(1) Trimming down to 5452 Ohm by heating pulses with increasing amplitude and fixed pulse width and fixed intervals between pulses—high precision is not important in this phase;

(2) Recovery using 3.18V heating pulses, up to 5504 Ohms (+4 Ohm error)—the 10 ms recovery pulse width was too high for the precise target;

(3) Trimming down using three pulses, to 5446 Ohm—high precision is not important in this "down" phase;

(4) Second attempt to recover using 2.86V pulses up to 5503 Ohms—demonstrating a lower recovery rate, while the pulse width was varied adaptively from 3 ms to 48 ms;

(5) Trimming down by three pulses, to 5468 Ohms—high precision is not important in this "down" phase;

(6) Third attempt to recover using 2.57V pulses up to 5501.5 Ohms (~270 ppm error)—demonstrating even lower recovery rate, while the pulse width was varied adaptively from 9 ms to 162 ms;

Note that the factor which limits the achievable precision in this example was the 12-bit resolution of the ADC. Note also that the entire multi-step procedure took less than 2.8 seconds.

Example 2

Figure 12:
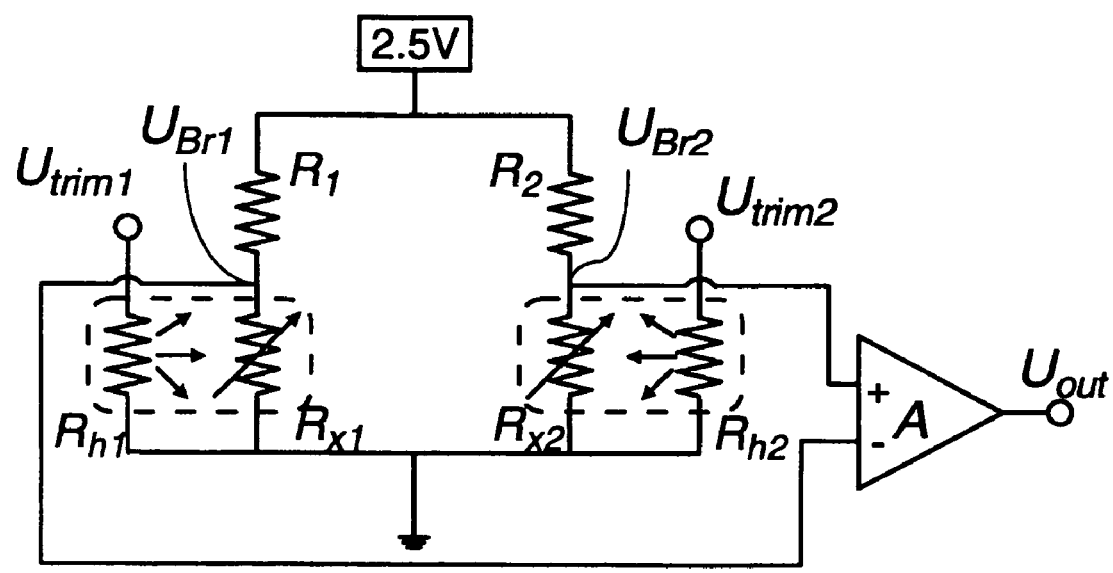
FIG. 12: Shows a bridge amplification circuit (gain approximately 400), used to measure high precision resistance adjustment.
Figure 13:
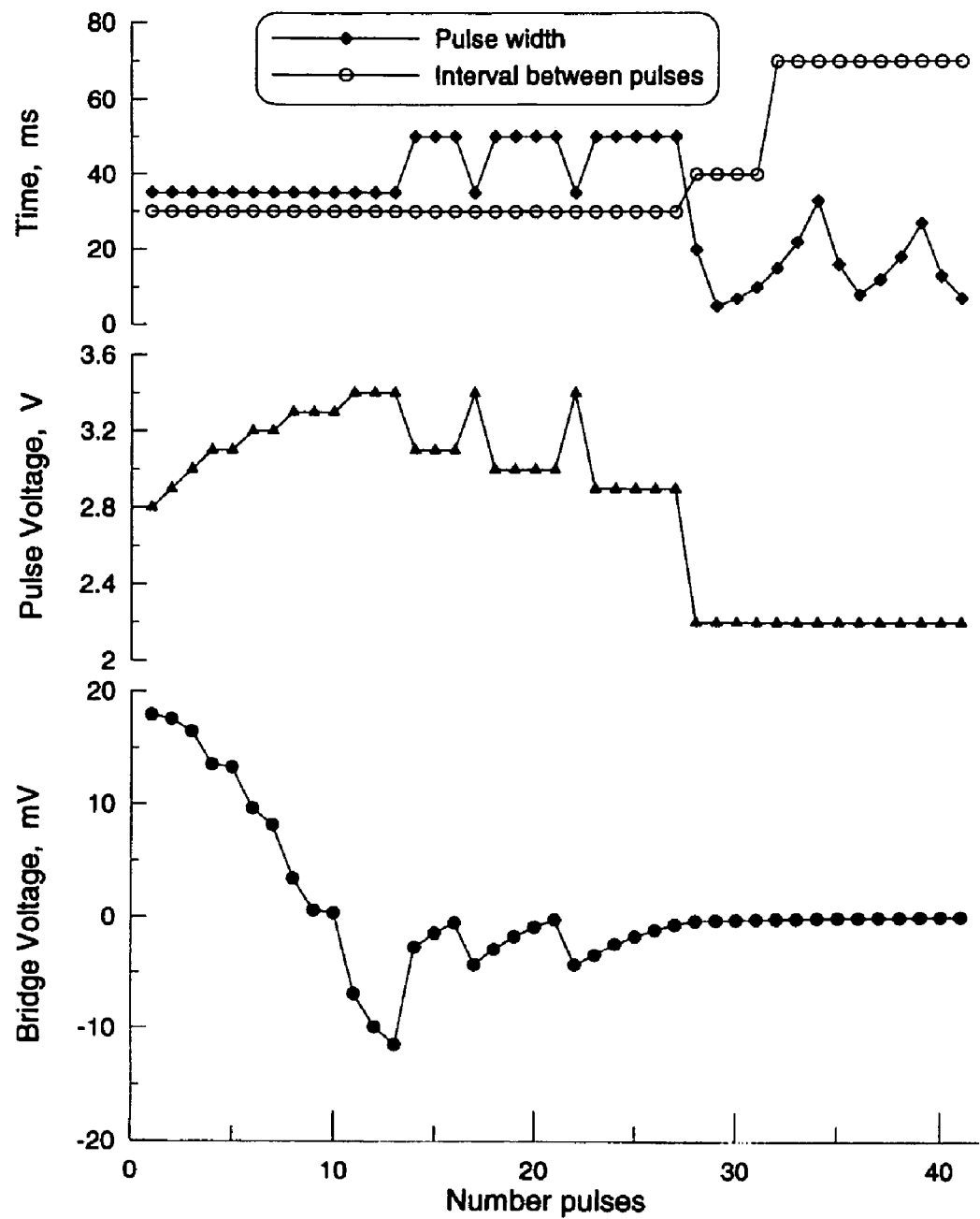
FIG. 13: Shows a quantitative example of a full adjustment pulse sequence (pulse amplitude and width, and inter-pulse interval), to adjust the FIG. 12 circuit to high-precision. The precision achieved was better than 10 ppm, and the sequence took 3.5 seconds in automated mode, to trim by an amount approximately 1.5% (15000 ppm) of the target resistance.

To prove higher-precision trimming, the electronic circuitry depicted on FIG. 12 was assembled and tested. Two functional trimmable polysilicon resistors $R_{x1}$ and $R_{x2}$, residing on suspended microstructures, are connected in a Wheatstone bridge configuration, together with two stable metal resistors $R_1$ an $R_2$. Auxiliary resistive heaters $R_{h1}$ and $R_{h2}$ are placed on suspended micro-structures, close to their corresponding functional resistor. The bridge is powered by 2.5V, and the voltage difference at the midpoints of the two bridge arms is amplified by instrumentation amplifier A1. Two functional resistors are trimmed from their as-manufactured resistance of approximately 7200 Ohms, down to approximately 5900 Ohms (in the middle part of an operating range between 6400 Ohms and 5100 Ohms). Heating pulses were generated by applying voltages at the points labeled $U_{trim1}$ and $U_{trim2}$. FIG. 13 shows the results of thermal trimming of the resistor $R_{x2}$ (trimming voltage $U_{trim2}$). The bridge voltage is a Referred-to-Input (RTI) voltage, calculated as the output voltage $U_{out}$, divided by the gain factor (in this case approximately 400), of the instrumentation amplifier. A 1.25 uV voltage difference across the bridge corresponds to approximately 1 ppm mismatch between resistors $R_{x1}$ and $R_{x2}$.

Adjustment was started from +18 mV of RTI bridge voltage, equivalent to +1.5% of resistor mismatch. Thirteen (13) heating pulses, with adaptively increasing amplitude, trimmed resistor $R_{x2}$ down so that the bridge voltage was reduced to −12 mV RTI. The first recovery stage (three pulses at 3.1V) gave too high a recovery rate. Then one 35 ms pulse at 3.4V trimmed the resistor down to −4 mV RTI, and a second recovery stage at 3.0V was started. The new recovery rate was also too high, and the resistor was trimmed down again to −4.3 mV RTI. The third recovery stage started at 2.9V and pulse width of 50 ms. When the bridge voltage was −0.7.mV RTI, a high-resolution recovery at voltage of 2.2V was initiated. After 14 heating pulses with adaptively changed pulse width, the bridge voltage was to −0.007 mV (~5.5 ppm mismatch). This procedure took 3.5 seconds in an automated mode. The effect of the last 8 pulses is magnified in FIG. 14, for better view of very subtle changes in the bridge voltage, corresponding to very high-precision changes in the resistance. Each pulse in FIG. 14 gives an adjustment roughly in the range of 10-15 ppm.

Outlined above are several examples of trimming operations. FIGS. 5-10 show more elementary examples of how the voltage pulse amplitudes, pulse duration, and between-pulse interval are varied to obtain a desired result, in a given set conditions (present and previous). Indeed, the example in FIG. 11, and its associated description, show how the more elementary principles in FIGS. 5-10 are used together to effectively reach a target resistance.

Figure 15:
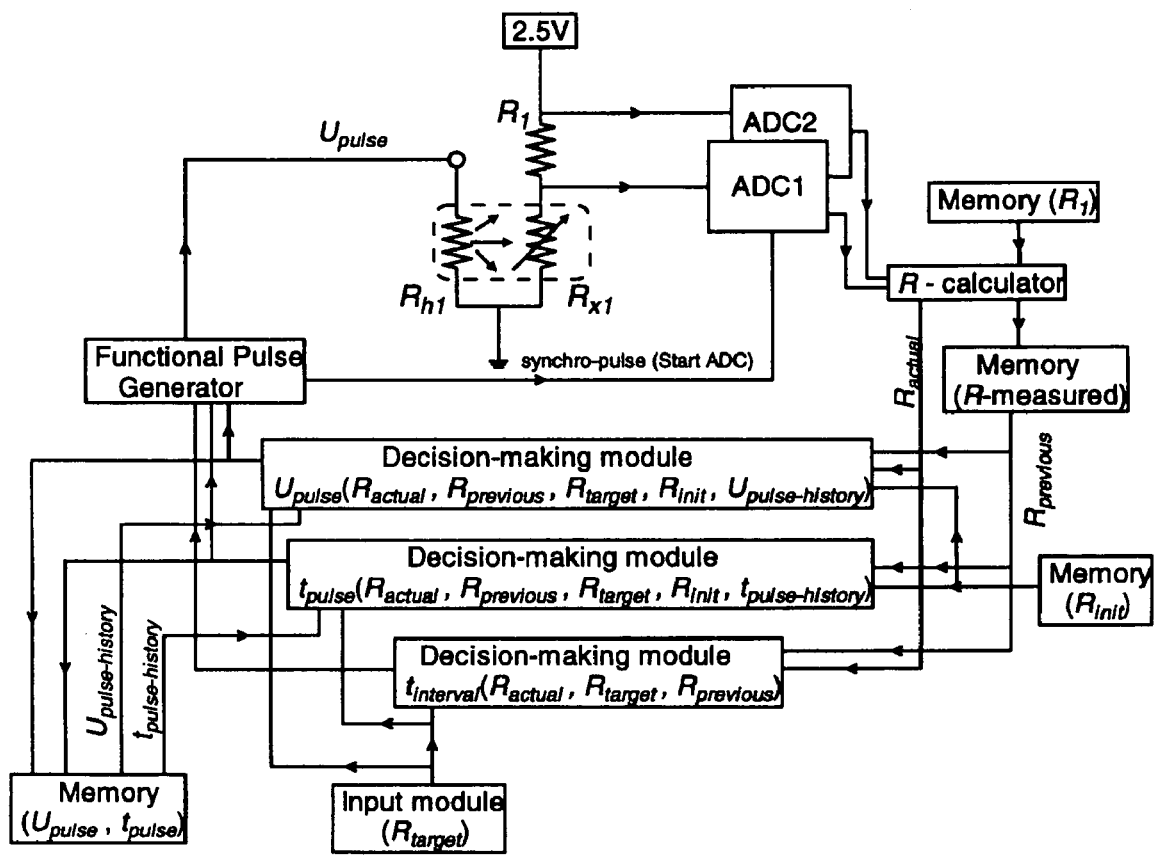
FIG. 15: Shows a schematic block diagram of the circuitry needed to implement the adaptive algorithm for bi-directional resistance adjustment (single resistor case).
Figure 16:
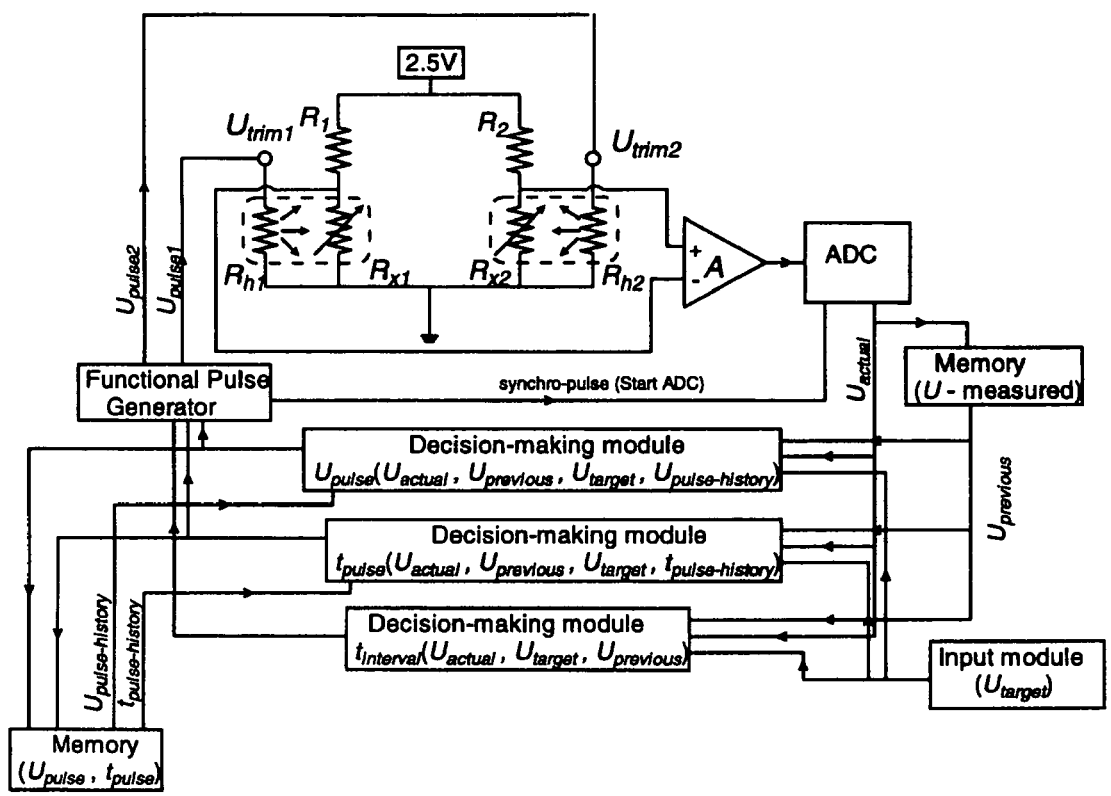
FIG. 16: Shows a schematic block-diagram of the circuitry for R-trimming (bridge resistor case).

The trimming circuitry consists of a decision-making module. For the sake of simplicity of the present description, FIGS. 15 and 16 illustrate three separate decision-making modules. It can be appreciated that these three modules are subsets of a general module that can perform the functions of all three of the modules described below.

Accordingly, FIG. 15 shows a schematic block diagram of the circuitry needed to implement the adaptive algorithm for bi-directional resistance adjustment. The operating principle of the trimming circuitry, for the single-resistor case, is as follows: The circuitry provides measurement of voltage drops across the trimmable resistor $R_{x1}$ (ADC1), and across the resistor divider containing resistors $R_{x1}$ and stable external resistor $R_1$ (ADC2). The resistance value of the resistor $R_1$ is stored in memory. The R-calculator module calculates resistance value $R_{actual}$ of the resistor $R_{x1}$ which is then stored in memory. The as-manufactured resistance value of the resistor, $R_{init}$, is stored in memory. The input module contains the target resistance value $R_{target}$ entered by the user.

The first decision-making module calculates the voltage pulse amplitude to be applied to the auxiliary heater $R_{h1}$ for the purposes of trimming the functional resistor $R_{x1}$. The voltage pulse amplitude is a function of:

actual (most-recently measured) resistance $R_{actual}$,
target resistance $R_{target}$,
resistance obtained after the previous trimming pulse $R_{previous}$ (stored in the memory module),
as-manufactured resistance $R_{init}$,
and voltage pulse amplitudes of one or several previous pulses $U_{pulse-history}$ The second decision-making module calculates the pulse width as function of:

$R_{actual}$,
$R_{target}$,
$R_{previous}$,
$R_{init}$,
$t_{pulse-history}$

The third decision-making module calculates interval between pulses as function of:

$R_{actual}$,
$R_{target}$,
$R_{previous}$

The pulse parameters, $U_{pulse}$, $t_{pulse}$ and $t_{interval}$ are sent to the Functional Pulse Generator. Parameters $U_{pulse}$ and $t_{pulse}$ are stored in memory to be used in the next pulse parameters calculation. The Functional Pulse Generator also sends synchronizing pulses to the ADCs to start the digitizing of analog signals at the end of the time interval between trimming pulses (before the next trimming pulse is applied).

Similarly to the above-described FIG. 11, FIGS. 13 and 14, and their associated description, show an example of how the more elementary principles in FIGS. 5-10 are used together to effectively adjust a certain parameter (not limited to resistance), of a system larger than just a resistor or resistors. In FIGS. 13 and 14, the goal of the trimming is to balance a Wheatstone bridge, in order to tune the output voltage of an amplifier (labeled "A" in FIG. 12 and again in FIG. 16).

Accordingly, FIG. 16 shows a schematic block diagram of the circuitry needed for trimming resistors in a bridge configuration. The circuitry is designed to trim either (or both) of the two resistors $R_{x1}$ or $R_{x2}$. The Functional Pulse Generator (function generator), therefore has two output channels. The output voltage is measured by the ADC and stored in memory. Again there are three decision-making modules.

The first decision-making module calculates voltage pulse amplitude to be applied to the auxiliary heater $R_{h1}$ or $R_{h2}$ for the purposes of trimming of the bridge. The voltage pulse amplitude is a function of:

actual (most-recent measured) voltage $U_{actual}$, target voltage $U_{target}$ (e.g. $U_{target}=0$ or some other predetermined value), voltage measured after previous trimming pulse $U_{previous}$ (stored in the memory)

and voltage pulse amplitude of one or more previous pulses $U_{pulse\text{-}history}$ The second decision-making module calculates pulse width as function of:

$U_{actual}$,
$U_{target}$,
$U_{previous}$
and $t_{pulse\text{-}history}$

The third decision-making module calculates interval between pulses as function of:

$U_{actual}$,
$U_{target}$,
$U_{previous}$

The pulse parameters, $U_{pulse}$, $t_{pulse}$ and $t_{interval}$ are sent to the Functional Pulse Generator. Parameters $U_{pulse}$ and $t_{pulse}$ are stored in memory to be used in the next pulse parameters calculation. The Functional Pulse Generator also sends synchronizing pulses to the ADCs to start the digitizing of analog signals at the end of the time interval between trimming pulses (before the next trimming pulse is applied).

The choice of a certain output channel for connection of the Functional Pulse Generator can be done manually, or automatically using certain application-specific criteria. For example, balancing a bridge can in general be done by adjustment of $R_{x1}$ alone, or $R_{x2}$ alone, or both.

By using the techniques described in the text above, it is possible to obtain high-precision adjustment (e.g. better than 100 ppm, such as 10-50 ppm), that is also bi-directional over a substantial range (e.g. 20% to 30%, or more, of the resistance value), and executable many times (e.g. 100 times or more), and where each adjustment is executable in a short time (e.g. less than one minute). Also, by using the techniques described in the text above, it is possible to obtain a high-precision adjustment that is bi-directional to a precision of better than 10 ppm in less than 10 seconds over a narrow or moderate adjustment range (e.g. less than 5%)

In general, it should be understood that there are many ways in which to realize the principles outlined above. This applies to each of the elementary techniques exemplified in FIGS. 5-10, and to full trimming sequences such as described in FIGS. 11 and 13, (which would use circuits such as described in FIGS. 15 and 16, respectively), and also to the implementations of trimming circuitry to trim resistance or larger systems (e.g. the circuitry described in FIG. 16 gives an example how resistor trimming can be used to adjust a certain parameter of a system larger than just a resistor or resistors, where the goal of the trimming circuitry is to balance the resistor bridge in order to tune the output voltage of the amplifier A to zero.)

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

The invention claimed is:

1. A method for trimming a parameter of a resistor made from a thermally mutable material, the method comprising:
   (a) in a first step, subjecting said resistor to a high first temperature by applying at least one heat pulse, to trim said parameter of said material in a first direction away from an original value;
   (b) in a second step, subjecting said resistor to a second temperature lower than said high first temperature by applying at least one heat pulse, so as to trim said parameter of said material in an opposite direction back towards said original value with a rate of change in said parameter that is initially rapid and gradually decreasing to a first level; and
   (c) in a third step, subjecting said resistor to a third temperature lower than said second temperature by applying at least one heat pulse, so as to trim said parameter in said opposite direction with said rate of change in said parameter that is greater than said first level.

2. A method as claimed in claim 1, wherein steps (b) and (c) are repeated with increasingly lower second and third temperatures.

3. A method as claimed in claim 2, wherein said increasingly lower second and third temperatures are selected to optimize a total trimming time.

4. A method as claimed in claim 2, further comprising selecting a predetermined number of iterations for said steps (b) and (c).

5. A method as claimed in claim 2, wherein said at least one of said first temperature and said second temperature is substantially near an upper threshold of applied temperature in order to maximize said trimming range of said parameter.

6. A method as claimed in claim 5, wherein said steps (b) and (c) are repeated until said resistor is subjected to a temperature approaching a lower temperature threshold for trimming, and a number of changes of temperature is selected to maximize said trimming range.

7. A method as claimed in claim 5, wherein a difference between said second temperature and said third temperature is optimized to maximize said trimming range.

8. A method as claimed in claim 1, wherein step (b) comprises regularly returning said resistor to a predetermined ambient temperature, measuring the parameter, and determining the rate of change, so as to decide whether to go on to step (c).

9. A method as claimed in claim 1, further comprising subjecting said resistor to a temperature substantially near a lower threshold of applied temperature for trimming to reach a target parameter value with a high level of precision.

10. A method as claimed in claim 9, wherein said temperature substantially near a lower threshold is selected in an adaptive process as a function of a value of said parameter previously attained.

11. A method as claimed in claim 9, wherein a trimming cycle comprises trimming in said first direction and trimming in said opposite direction, and a plurality of said trimming cycles are used to reach a target value.

12. A method as claimed in claim 1, wherein step (a) is repeated with an increasingly higher first temperature until said parameter has been trimmed in said first direction to a desired value.

13. A method as claimed in claim 12, wherein said increasingly higher first temperature is selected dependent on a remaining distance to said desired value.

14. A method as claimed in claim 12, wherein said increasingly higher first temperature is selected dependent on an increment obtained by a preceding high first temperature.

15. A method as claimed in claim 1, wherein step (b) and (c) comprises regularly returning said resistor to a predetermined ambient temperature and measuring the parameter.

16. A method as claimed in claim 1, wherein each of said steps (a), (b) and (c) comprise applying at least one heat pulse each having a given amplitude to said resistor.

17. A method as claimed in claim 16, wherein said applying comprises selecting a predetermined number of heat pulses at each of said given amplitudes to reach a value estimated to be near a target value.

18. A method as claimed in claim 17, wherein said second temperature is a predetermined percentage of a last pulse of said first temperature.

19. A method as claimed in claim 17, wherein said resistor is provided on a thermally isolated micro-platform, and said heat pulses are directed to said micro-platform.

20. A method as claimed in claim 19, wherein said high precision is less than 100 parts per million.

21. A method as claimed in claim 19, wherein said high precision is from about 50 parts per million to about 10 parts per million.

22. A method as claimed in claim 16, wherein said applying comprises selecting a sequence of heat pulses at said given amplitude to have varying durations.

23. A method as claimed in claim 22, wherein said selecting a sequence of heat pulses comprises selecting said first heat pulse of said sequence of heat pulses to have a substantially small duration but sufficient to reach a steady state of temperature.

24. A method as claimed in claim 22, wherein said varying durations is based on at least one of an increment of trimming in the parameter obtained by a preceding heat pulse, a duration of a preceding heat pulse, and a remaining distance to a target value for the parameter.

25. A method as claimed in claim 22, wherein said applying comprises modulating an interval between each heat pulse.

26. A method as claimed in claim 25, wherein said modulating comprises providing a shorter interval when a distance to a target value is large and a longer interval when said distance to said target value is small.

27. A method as claimed in claim 1, wherein said resistor is provided on a thermally isolated micro-platform.

28. A method as claimed in claim 1, wherein said resistor is made of polysilicon.

29. A method as claimed in claim 1, wherein said parameter is resistance; and wherein said first direction is down, and said opposite direction is up.

30. A method for trimming a parameter of a resistor made from a thermally mutable material to a target value with a high precision, said resistor having a trimming range defined by an upper limit above which damage will occur and a lower limit below which a change in parameter value is insignificant, the method comprising:
    in a first step, trimming said parameter to a first intermediary value within a small amount below said target value by applying at least one heat pulse;
    in a second step, selecting a sequence of heat pulses having amplitudes substantially near said lower limit of said trimming range; and
    in a third step, applying said sequence of heat pulses to said resistor to trim said parameter towards said target value.

31. A method as claimed in claim 30, wherein said selecting a sequence of heat pulses comprises selecting each heat pulse of said sequence of heat pulses to have a varying duration.

32. A method as claimed in claim 31, wherein said selecting a sequence of heat pulses comprises selecting said first heat pulse of said sequence of heat pulses to have a substantially small duration sufficient to reach a steady state of temperature.

33. A method as claimed in claim 31, wherein said selecting a sequence of heat pulses comprises decreasing a duration of each succeeding heat pulse.

34. A method as claimed in claim 30, wherein said selecting a sequence of heat pulses comprises selecting a duration of each succeeding heat pulse as a function of at least one of an increment of trimming in the parameter obtained by a preceding heat pulse, a duration of a preceding heat pulse, and a remaining distance to said target value.

35. A method as claimed in claim 30, wherein said selecting a sequence of heat pulses comprises selecting pulses that will trim said parameter value in a first direction beyond said target value, and in an opposite direction back towards said target value.

36. A method as claimed in claim 30, wherein said selecting a sequence of heat pulses comprises selecting a sequence of heat pulses at a fixed amplitude with varying durations.

37. A method as claimed in claim 30, wherein said resistor is provided on a thermally isolated micro-platform.

38. A method as claimed in claim 30, wherein an initial value of said parameter is higher than said target value, and said trimming said parameter to a first intermediary value within a small amount below said target value comprises trimming past said target value.

* * * * *